(12) United States Patent
Pazidis et al.

(10) Patent No.: US 7,738,187 B2
(45) Date of Patent: Jun. 15, 2010

(54) OPTICAL ELEMENT, PROJECTION LENS AND ASSOCIATED PROJECTION EXPOSURE APPARATUS

(75) Inventors: Alexandra Pazidis, Essingen-Lautenburg (DE); Stephan Six, Aalen (DE); Ruediger Duesing, Neu-Ulm (DE); Gennady Fedosenko, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 188 days.

(21) Appl. No.: 12/134,062

(22) Filed: Jun. 5, 2008

(65) Prior Publication Data
US 2008/0304035 A1    Dec. 11, 2008

(30) Foreign Application Priority Data
Jun. 5, 2007 (DE) ................ 10 2007 026 500

(51) Int. Cl.
*G02B 13/14* (2006.01)
(52) U.S. Cl. .................. 359/722; 359/647; 359/355
(58) Field of Classification Search ......... 359/350–361, 359/642–797
See application file for complete search history.

(56) References Cited

U.S. PATENT DOCUMENTS

| 4,617,057 A | 10/1986 | Plueddemann |
| 5,494,712 A | 2/1996 | Hu et al. |
| 5,997,943 A | 12/1999 | Azzopardi et al. |
| 2005/0225737 A1 | 10/2005 | Weissenrieder et al. |
| 2006/0132736 A1 | 6/2006 | Nagasaka et al. |
| 2007/0122547 A1 | 5/2007 | Begon et al. |

FOREIGN PATENT DOCUMENTS

| CA | 2302118 A1 | 9/2000 |
| DE | 199 14 007 A1 | 10/2000 |
| JP | 11149812 A | 6/1999 |
| JP | 2003-161806 A | 6/2003 |
| JP | 2005-268759 A | 9/2005 |
| WO | 00/42244 | 7/2000 |
| WO | 2006/133884 A2 | 12/2006 |

*Primary Examiner*—Darryl J Collins
(74) *Attorney, Agent, or Firm*—Sughrue Mion, PLLC (57) ABSTRACT

An optical element (1) made of a material that is transparent to wavelengths in the UV region, which optical element (1) includes an oleophobic coating (6, 7) outside of its optically free diameter whose disperse component of the surface energy is preferably 25 mN/m or less, particularly preferably 20 mN/m or less, in particular 15 mN/m or less. In addition or as an alternative, the optical element (1) within its optically free diameter comprises an oleophilic coating (9b, 9c) that is transparent to wavelengths in the UV region, with the disperse component of the surface energy of this coating preferably being more than 25 mN/m, particularly preferably more than 30 mN/m, in particular more than 40 mN/m. The optical element may be provided in an arrangement in which it dips at least partially into an organic liquid.

31 Claims, 2 Drawing Sheets

OPTICAL ELEMENT, PROJECTION LENS AND ASSOCIATED PROJECTION EXPOSURE APPARATUS

The following disclosure is based on German Patent Application No. DE 10 2007 026 500.1, filed on Jun. 5, 2007, which is incorporated into this application by reference.

BACKGROUND TO THE INVENTION

The invention relates to an optical element made of a material that is transparent to wavelengths in the UV region, as well as to a projection lens and to a projection exposure apparatus for immersion lithography including such an optical element.

The wetting behaviour of surfaces of optical elements with liquids can be described by the so-called contact angle, which a droplet of liquid encloses with a surface of the optical element. If the liquid completely wets the surface, the contact angle is 0°; if the contact angle is less than 90° and water is the wetting liquid, this is referred to as a hydrophilic surface; and in the case of a contact angle of more than 90° as a hydrophobic surface.

Wetting with liquids, in particular with water, as a rule has a negative effect on the optical characteristics of the optical elements. As a result of wetting, it is possible, for example, for contaminating substances such as salts to form on the surfaces of the optical elements. In order to prevent wetting of optical elements with water or in order to quickly remove water from the optical elements, it is known to provide optical elements with hydrophobic coatings.

For example, in JP 2003-161806 A an optical element with an antireflection coating is described in which optical element a water-repellent coating is formed in a non-coated region of the glass substrate. In this arrangement the water-repellent coating can be formed so as to be adjacent to the antireflection coating, or on a lateral edge of the glass substrate. This is intended to prevent moisture lodging in the space between the optical element and a holding structure associated with the optical element.

In U.S. Pat. No. 5,494,712 a method for applying a layer of a polymer onto a substrate in order to reduce its wetting by water is described. The layer preferably comprises one or several organo-silicon compounds, e.g. silanes or siloxanes, and is applied by means of plasma-enhanced chemical vapour deposition (PECVD).

The problem of wetting also plays a role in microlithography, especially in immersion lithography. In microlithography, for the purpose of producing semiconductor components, structures on a mask are imaged at a reducing scale onto a light-sensitive substrate by means of a projection lens. In order to achieve the high resolution that is required for such applications, illumination radiation in the UV-wavelength region is used, typically below 250 nm. In order to achieve a further increase in the resolution and depth of field, in immersion lithography a liquid, as a rule distilled water, is placed between the last optical element of the projection lens and the light-sensitive substrate so as to increase the refractive index. In this arrangement the last optical element is at least in part wetted by water, which is why in the regions of the last optical element in which contact with water is to be avoided hydrophobic water-resistant coatings are used to an increased extent.

From JP 2005-268759 A a component has become known which is arranged in a projection exposure apparatus for immersion lithography, and which on at least one surface is subjected to exposure radiation. On the surface, an adhesive layer of silicon dioxide ($SiO_2$), magnesium fluoride ($MgF_2$) or calcium fluoride ($CaF_2$) is arranged, onto which a water-repellent layer is applied that comprises an amorphous fluorocarbon polymer.

JP11-149812 describes an optical element in which a hydrophobic protective layer, preferably comprising a fluorocarbon polymer, is applied to a reflection-increasing or reflection-decreasing multilayer system so as to protect against ingress of humidity from the ambient air. The thickness of the protective layer is between 1 nm and 10 nm in order to prevent excessive absorption of the radiation by the fluorocarbon polymer at wavelengths of less than 250 nm.

In order to further increase the resolution and depth of field in immersion lithography, in future there will be immersion liquids that have a refractive index that is higher than that of water ($n_w$=1.43). In the case of these highly refractive liquids, the solutions developed for water cannot, as a rule, be applied.

OBJECT OF THE INVENTION

It is the object of the invention to provide an optical element that is suitable for immersion lithography with highly refractive immersion liquids, and to provide a projection lens and a projection exposure apparatus with such an optical element.

SUMMARY OF THE INVENTION

According to one formulation of the invention, an optical element is provided in which the optical element includes an oleophobic coating outside of its optically free diameter whose disperse component of the surface energy is preferably 25 mN/m or less, particularly preferably 20 mN/m or less, in particular 15 mN/m or less.

For UV applications, above all organic liquids, hereinafter designated "oils" for the sake of simplicity, can be considered as highly refractive liquids. The inventors have found that wetting the optical element with a largely non-polar immersion liquid outside the optically free diameter can also have a negative effect on the optical characteristics of the optical element, namely as a result of cold due to evaporation arising as a result of wetting. As a result of this, a heat sink is created in the wetted region, which heat sink can have a negative effect on the temperature equilibrium of the optical element, and, for example in the case of lenses as optical elements, can lead to undesirable imaging errors. This problem occurs in particular on matte surfaces, i.e. in particular outside the optically free diameter, because liquid flows away less readily from matte surfaces than it does from polished surfaces. By applying an oleophobic coating, i.e. a coating that to a large extent repels non-polar immersion liquids, wetting in this region can be reduced, which improves the quality of the image. The optical element is therefore preferably used in an arrangement in which it dips at least partly into an organic liquid, e.g. an immersion liquid of the type IF132 (by DuPont).

The term "free optical diameter of an optical element" refers to the region through which radiation passes in a directed manner, i.e. that region which for example in the case of a lens contributes to imaging. It is understood that the term "optically free diameter" does not necessarily mean a circular geometrical area, since this term defines in general the area on an optical element, which is utilized for imaging (footprint), and which may also have any asymmetrical, in particular, almost rectangular geometrical shape. It is also understood that the center of the "optically free diameter" does not necessarily have to coincide with the optical axis. The area of the optically free diameter can, in fact, also be shifted with respect to the optical axis. In this arrangement the optically free diameter can, in particular, be determined by the region of the surface at which the lens surface is polished, whereas the region outside this diameter can have a non-polished, matte, and thus rough surface, which is referred to as the "lens cylinder". The term "oleophobic coating" refers to a coating which includes an oleophobic surface, i.e. it is not necessary for the entire coating to include oleophobic materials.

A definition of an oleophobic surface, which definition does not depend on the wetting liquid, consists of stating the non-polar component of the surface energy of the surface as an absolute value. The latter can be determined by way of contact angle measurement with at least two different liquids, for which purpose a mathematical model for the relationship between the adhesion work W, the surface energy $y_s$ of the surface, and the surface tension $y_L$ of a wetting liquid droplet is required, which according to the model of Owen, Wendt, Rabel, Kälble, by means of which model the values stated herein below have been determined, is given by:

$$W=2(y_S^d y_L^d)^{1/2}+2(y_S^p y_L^p)^{1/2},$$

wherein both the surface energy $y_S=Y_S^d+y_S^p$ and the surface tension $y_L=y_L^d+y_L^p$ are divided into a polar component ($y_S^p$ or $y_L^p$) and a disperse component ($y_S^d$ or $y_L^d$), which components determine the interaction between the liquid and the surface. In the case of water, the polar component is dominant; in the case of organic liquids, usually the disperse component is dominant. In order to achieve little wetting with an organic liquid it is thus necessary to apply to the optical element a coating with a small disperse component of the surface energy.

In an advantageous embodiment, the oleophobic coating is designed to form a contact angle of 50° or more to a non-polar liquid. The term "oleophobic" can also be defined by way of the (essentially non-polar) highly refractive liquid with which the optical element is made to come into contact. According to this definition, a coating is oleophobic if the highly refractive liquid forms a contact angle of 50° or more to the surface of the optical element. In the context of the present application, the term "oleophobic" refers to a coating that meets at least the criteria of one of the two definitions as far as the disperse component or the contact angle is concerned.

In an advantageous embodiment, the oleophobic coating includes a polar component of the surface energy of 10 mN/m or more, preferably of 20 mN/m or more, in particular of 30 mN/m or more. While in wetting a surface with an oil the extent of polarity often plays a subsidiary role, a coating having a high polar component is nevertheless advantageous in ensuring good adhesion of the coating at the surface of the optical element or of further, preferably oxidic, layers of the coating. Furthermore, an oleophobic coating with a high polar component significantly differs from hydrophobic coatings that have a lower polar component $y_L^p$ in order to prevent wetting with water (having a polar component of approximately 50 mN/m). Preferably, in the present case the oleophobic coating includes a single oleophobic layer.

In an advantageous embodiment, a reflection-reducing coating is applied to the optical element, wherein the oleophobic coating is applied to a non-coated region of the optical element, preferably adjacent to the reflection-reducing coating. The antireflection coating is, as a rule, applied at least in the region of the free optical diameter of a lens, and usually includes several layers in which materials of high and of low refractive index alternate. Preferred embodiments of antireflection coatings are given in PCT/EP2006/005630 of the applicant, with is included by reference to form part of the content of the present application.

In a further preferred embodiment, the oleophobic coating includes at least one oleophobic layer that is selected from the group consisting of silanes, siloxanes and diamond-like carbon. In the case of silanes, siloxanes and diamond-like carbon, the degree to which they are oleophobic or oleophilic can be adjusted within certain limits, and in the present case is selected such that the mentioned materials form the desired large contact angle (greater than or equal to 50°) to the non-polar immersion liquid or have the desired polar or disperse component of the surface energy. Short-chain or highly branched solid organic materials that include elements that are lighter than silicon are also suitable as oleophobic coatings. These materials preferably include polar groups. Nitrocellulose is an example of such a material. PP (polypropylene) is an example of a material without a polar group. In this polymer and in some other polymers the length of the groups and the branching can be influenced by process management. Products such as Optron by Merck, Ormocere by ISC Wurzburg, Cytop by Asahi, or Teflon AF by DuPont are also well suited. It is understood that an oleophobic coating forms the cover layer of the coating. A rough or structured substrate surface can reinforce the oleophobic characteristics of the coating.

In a further preferred embodiment, the oleophobic coating includes at least one oleophobic layer, preferably with a polar component of the surface energy of 10 mN/m or less, particularly preferably of 5 mN/m or less, in particular of 3 mN/m or less, wherein the oleophobic layer is applied to an adhesive layer. If the oleophobic layer includes only a small polar component, for better adhesion it can be applied to an adhesive layer. Such an adhesive layer is, for example, advantageous if the optical element includes an oxidic material, and the oleophobic layer includes a material, as a rule an organic material, that essentially includes only a disperse component. In this case preferably a material with a polar and disperse component, e.g. sapphire ($Al_2O_3$) or fused silica ($SiO_2$), is selected as an adhesive layer. Also well suited are gradient coatings with transitions from oxide to metal. In this case a start is made with chromium oxide (with a polar component) on the optical element, and the finish includes chromium (with a disperse component) on the oleophobic coating, wherein the transition can be continuous or in steps.

In a further advantageous embodiment the oleophobic coating includes at least one layer that is non-transparent to wavelengths in the UV region. In this way it is possible to prevent diffused light from reaching the wafer when the optical element is also transparent to UV radiation outside the optically free diameter. If the oleophobic layer itself is transparent to UV radiation, in addition an absorbent layer can be provided which can, for example, include tantalum pentoxide ($Ta_2O_5$), titanium dioxide ($TiO_2$) or hafnium dioxide ($HfO_2$). This layer can at the same time be provided as an adhesive layer and if need be can have a gradient in the oxide content, i.e. be designed as a gradient layer.

Embodiments of the invention can also be implemented in an optical element that within its optically free diameter includes a coating that is transparent to wavelengths in the UV region and that is oleophilic, with the disperse component of the surface energy of the coating preferably being more than 25 mN/m, particularly preferably more than 30 mN/m, in particular more than 40 mN/m. Such an optical element can advantageously be used in an arrangement in which the optical element is at least partly immersed in an organic liquid. In the sense of this application the term "oleophilic coating" refers to a coating which includes the stated values of the disperse component of the surface energy and/or encloses a contact angle of less than 30° to a largely non-polar liquid. In addition to the oleophilic coating, the optical element can advantageously include an oleophobic coating outside the optically free diameter, as shown above.

In a preferred embodiment, the oleophilic coating includes a polar component of the surface energy of 10 mN/m or more, preferably of 20 mN/m or more, in particular of 30 mN/m or more. In addition to a large disperse component, the polar component can also be selected so as to be large in order to ensure a good connection to the fluoridic or oxidic substrate material of the optical element or of an antireflection coating (see below).

Preferably, the oleophilic coating is applied to a reflection-reducing coating. Such an antireflection coating is applied to reduce the residual reflection from the surfaces of the optical element, which residual reflection would otherwise impinge upon the wafer.

In an advantageous improvement the oleophilic coating includes at least one oleophilic layer including a material selected from the group consisting of: silanes, siloxanes, diamond-like carbon (DLC), chlorofluoro polymers, fluoroiodine polymers, bromofluoro polymers, gadolinium (Gd), tellurium (Te), selenium (Se), erbium (Er), silver (Ag), gold (Au) and platinum (Pt). Also advantageous are organic coating materials with long lightly-branched chains and polar groups, e.g. polyamides or polyurethanes. Also advantageous are organic materials that can also include elements that are heavier than silicon. For example in a fluorocarbon polymer such as Cytop (by Asahi) or Teflon AF (by DuPont) part of the fluorine atoms can be replaced by chlorine, bromine and/or iodine. As an alternative, such replacement can also be undertaken in all fluorine atoms, so that fluorine-free chloropolymers, iodine polymers and/or bromopolymers arise which can be used as coating materials.

Siloxanes can be cured by means of UV light or thermally, or they can be applied by means of a CVD process. In the case of silanes, siloxanes and DLC, the degree to which they are hydrophilic or hydrophobic, resp. oleophilic or oleophobic can be set within certain limits, and in the present case is selected such that these materials form the desired low contact angle to the non-polar immersion liquid, or include the above-stated disperse and polar components of the surface energy, respectively.

Particularly preferred is an oleophilic layer with a thickness of 5 nm or less, in particular of 2 nm or less. Small layer thicknesses are advantageous in particular in such oleophilic layers whose refractive index is low when compared to that of the immersion liquid and to the material of the optical element, which makes it difficult for effective transmission from the optical element to the immersion liquid to take place. Furthermore, with a small layer thickness, absorption in the oleophilic coating can be reduced.

The oleophilic layer is preferably applied to an adhesive layer that is preferably made from a transparent material such as fused silica ($SiO_2$), lanthanum fluoride ($LaF_3$) or magnesium fluoride ($MgF_2$). The adhesive layer can counteract any degradation of the oleophilic layer during UV irradiation. In this arrangement, in the case of an oleophilic layer including a single chemical element, a fluorine- or oxide gradient can be produced in that a very thin layer (less than 5 nm) of an oxide or fluoride of the respective element is applied as an adhesive layer.

Some of the above-mentioned materials are not long-time stable if they are exposed to UV light at radiation intensities common in microlithography. In this respect the term "long-time stable" refers to a service life of, typically, more than seven years. As a result of the UV irradiation, in addition, in many of the above-mentioned materials the substrate adhesion and the oleophilic characteristics can be impeded. It may therefore make sense to design the optical element for installation in an optical instrument, e.g. a projection lens, so that it is exchangeable, and consequently the optical element including the degraded coating can be replaced by a new element. If need be, a degraded oleophilic coating can be renewed also in situ, without there being a need to deinstall the optical element from the optical instrument, in particular if it is an element whose surface is accessible from the outside, e.g. in the case of a terminating element of a projection lens.

In a further advantageous embodiment, the transparent material of the optical element is selected from the group consisting of: barium fluoride ($BaF_2$), fused silica ($SiO_2$), potassium chloride (KCl), sodium chloride (NaCl), spinel ($MgAl_2O_4$), sapphire ($Al_2O_3$), magnesium oxide (MgO), calcium oxide (CaO), lutetium aluminium garnet (LuAG) and germanium dioxide ($GeO_2$). At a wavelength of 193 nm these materials have the following refractive indices: $BaF_2$=1.57; crystalline $SiO_2$=1.66; KCl=1.76; NaCl=1.83; $MgAl_2O_4$=1.87; sapphire=1.93; MgO=2.00; LuAG=2.14; $GeO_2$=2.05; CaO=2.70. It is understood that apart from crystalline $SiO_2$ it is also possible to use amorphous $SiO_2$, which has a lower refractive index than crystalline $SiO_2$. Other materials, e.g. calcium fluoride ($CaF_2$), are also possible.

In a further preferred embodiment, at least one layer of the oleophilic coating or of the oleophobic coating is applied by a method selected from the group consisting of: PVD (physical vapour deposition), CVD (chemical vapour deposition), PECVD (plasma-enhanced CVD), cold gas spraying, spin coating, plasma spraying, IBS (ion beam sputtering), magnetron sputtering, pyrolysis, dip coating, spraying and manual coating, in particular application by brush or sponge. The first-mentioned methods relate to techniques for coating substrates by vapour deposition onto the surfaces to be coated. Plasma coupling in PECVD can, for example, take place by means of microwave radiation or high-frequency (RF) radiation, while the PVD method can, for example, be ion-supported or plasma-supported. In magnetron sputtering a low-temperature plasma in an inert gas (usually argon) is used in order to remove a target material and deposit it on an opposite substrate; while in ion-beam sputtering an ion beam is used for this purpose. In the pyrolysis method, e.g. in the production of parylene coatings, a dimer is vaporised and subsequently pyrolytically split into monomers that subsequently deposit as thin coatings on the substrate. In cold gas spraying, the coating material is applied to the carrier material in powder form at very high speed. In rotation coating, thin and even coatings are applied or thrown onto a rotating substrate. In plasma spraying a powder is injected into a plasma jet, which powder is melted on as a result of the high plasma temperature, and with the plasma jet is thrown onto the workpiece to be coated. By means of dip coating the coating can be applied evenly. Application by brush and sponge are options of manual coating.

A further aspect of the invention is realized in an optical element as described above, in which the oleophobic coating and/or the oleophilic coating are microstructured and/or arranged on a microstructured surface of the optical element. A microstructured surface thereby means a surface having structures in the micro- or nanometer range, wherein the exact geometrical shape of the microstructures is not decisive as long as the topography of the surface resulting from microstructuring has a higher surface roughness compared to a surface that is not microstructured, such that the overall surface area is increased. The coating itself may also be microstructured, in which case the thickness of the coating should not be too small.

The inventors have found that micro structuring of the element body and/or the coating can increase both the oleophobic properties of the oleophobic coating as well as the oleophilic properties of the oleophilic coating. The microstructured surface may thereby be produced, in particular, through etching of of the coating or of an uncoated part of the element body. Towards this end, an etching mask may initially be disposed onto the element body or coating and subsequently, the structure of the etching mask can be transferred to the element body or coating underneath through a conventional wet-chemical or plasma-based etching method. When the optical element is provided with an oleophilic coating in a first area, and with an oleophobic coating in a second area located next to the first area, the microstructures can be generated in both areas with one single etching process.

The microstructures preferably have a structural width distribution, wherein less than 1%, preferably less than 0.5%, in particular, less than 0.1% of the microstructures have a structural width of more than 200 nm, preferably of more than 100 nm. By providing structures having such small structural widths, it is possible to prevent or at least greatly reduce the generation of stray light, since the structural widths are substantially below the wavelength of the radiation used, i.e. below 248 nm or 193 nm. When the microstructures are distributed over the surface of the element body or the coating in a particularly homogeneous way, in order to prevent stray light, the widths of the microstructures need not necessarily be smaller than the wavelength used for the irradiation, in particular, when they are formed outside of the optically free diameter.

In a preferred embodiment the optical element is designed as a piano-convex lens, wherein at the planar surface a conically shaped lens part is formed. Such an optical element is preferably used as a terminating element of a projection lens for immersion lithography. In this arrangement the face of the conically shaped lens part is brought into contact with the immersion liquid in order to increase the numerical aperture of the lens.

In a further preferred embodiment the oleophobic coating is applied to the conical circumferential surface of the conically formed lens part and/or to the planar surface. Since the conically formed lens part is in contact with the immersion liquid there is a danger, in particular in the case of the conical circumferential surface, in that this surface is wetted by the immersion liquid, wherein wetting can extend from there to the planar surface. As a result of the oleophobic coating, wetting, and thus lowering of the temperature of the optical element, in this region can be prevented. In addition or as an alternative, the oleophobic coating can also be applied to a marginal region, e.g. a lateral surface, of the lens, at which marginal region the lens is in contact with a holding device. In this way ingress of the immersion liquid into a gap between the lens and the holding device can be prevented.

Embodiments of the invention can be implemented in a projection lens for imaging a structure onto a light-sensitive substrate, including at least one optical element as described above, which optical element is preferably a terminating element of the projection lens, in particular, an asymmetrical terminating element that is arranged so as to be adjacent to the light-sensitive substrate. In such a lens, imaging errors caused by wetting the last lens element can be prevented. An asymmetrical lens element means a lens element which is not rotationally symmetrical with respect to an axis of symmetry that typically coincides with the optical axis.

Preferably, the optical element is held in the projection lens by means of a detachable connection, i.e. the holding device of the optical element is designed such that it can be connected to the projection lens and can be disconnected without any need to dismantle the projection lens for this purpose. In such a holding device the detachable connection can, for example, be established by a spring or by a thread. Exchanging the optical element can become necessary when the oleophilic coating has been degraded as a result of UV irradiation.

The invention is further realised in a projection exposure apparatus for immersion lithography, including: an illumination system; a projection lens as described above; a light-sensitive substrate; and a preferably non-polar immersion liquid, in particular HIL-203, HIL-204, IF131, IF132, IF169, IF175, n-decane, n-hexane, dekalin (decahydronaphthalene), cyclo-decane or cyclo-hexane, which immersion liquid is placed between the light-sensitive substrate and the closing element, wherein the closing element preferably with a face of a conically formed lens part dips into the immersion liquid. In this arrangement the immersion liquid should have a refractive index greater than that of water, i.e. a refractive index which at a wavelength of 193 nm is greater than 1.43. This applies for the above-mentioned substances, wherein HIL-203 and HIL-204 are product names for liquids with high refractive index by JSR Corporation, and IF131, IF132, IF169, IF175 are product names for liquids with high refractive index by DuPont. If the optical element has an oleophobic coating, then this coating forms a contact angle of 50° or more to the immersion liquid; if the optical element, in addition or as an alternative, includes an oleophilic coating, it forms an angle of 30° or less, in particular of 5° or less with the immersion liquid. A projection exposure apparatus designed in this way makes it possible to image the smallest of structures at high resolution and with great depth of field.

Advantageously, the refractive index of the oleophilic layer is the same as the refractive index of the immersion liquid. In this case the thickness of the oleophilic layer does not have any influence on the effective transmission from the terminating element to the immersion liquid. Consequently, the layer can be applied so as to be very thick, e.g. greater than 50 nm. In such a layer, a change in thickness does not have a negative effect on the optical performance over the entire service life, so that there is no need to exchange the terminating element.

In an advantageous embodiment, the refractive index $n_L$ of the oleophilic layer is determined by $n_L = \sqrt{n_A n_S}$, wherein $n_A$ denotes the refractive index of the immersion liquid, and ns denotes the refractive index of the material of the optical element. In this way an ideal antireflection coating can be formed, wherein the optical thickness of the layer should be in the region of approximately $\lambda/4$ when no antireflection coating is applied to the optical element. If the oleophilic layer is applied to an antireflection coating, the refractive index and the coating thickness of the oleophilic layer have to be taken into account when determining the refractive indices and layer thicknesses of the individual layers of the antireflection coating.

Further characteristics and advantages of the invention are provided in the following description of exemplary embodiments of the invention, in the figures of the drawing that show details which are significant in the context of the invention, and in the claims. Individual characteristics can be implemented individually per se, or they can be implemented to form several characteristics in any combinations in a variant of the invention.

BRIEF DESCRIPTION OF THE DRAWINGS

Exemplary embodiments are shown in the diagrammatic drawing and are explained in the description below. The following are shown.

DESCRIPTION

Figure 1A:
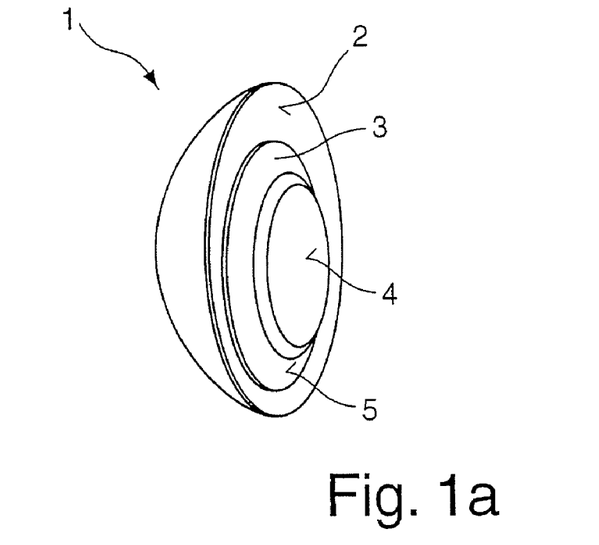
FIGS. 1a,b a diagrammatic view of an embodiment of an optical element with an oleophobic and an oleophilic coating (a) in a perspective view and (b) in a sectional view.
Figure 1B:
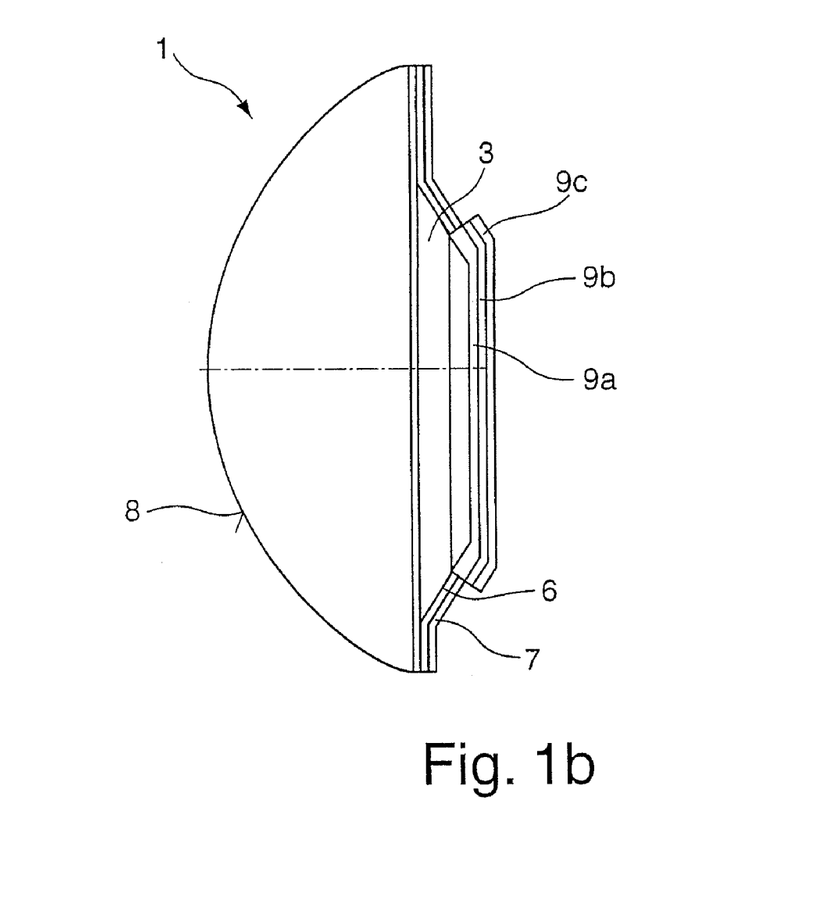

FIGS. 1a,b diagrammatically show an optical element 1 that includes lutetium aluminium garnet (LuAG, $Lu_3Al_5O_{12}$), is designed as a piano-convex lens, and on one planar surface 2 includes a conical lens part 3 in the form of a truncated cone, which is shifted with respect to the center of the optical element 1. The conical lens part 3 includes two sub-regions with different opening angles and includes an end face 4 to which an antireflection coating 9a (not shown in FIG. 1a) is applied. It is understood that it is not mandatory for optical elements for immersion lithography to have the form described above.

In operation only that part of the UV radiation used is to contribute to imaging, which part passes through the face 4 so that the diameter of this end face 4 approximately determines the free optical diameter. It is understood that it may also be possible to do without the antireflection coating 9a. Furthermore, the optical element 1 can also consist of some other material that has a high refractive index and that is highly transparent above the wavelength of 190 nm, for example a material including crystalline fused silica ($SiO_2$), barium fluoride ($BaF_2$), amorphous fused silica ($SiO_2$), potassium chloride (KCl), sodium chloride (NaCl), spinel ($MgAl_2O_4$), sapphire ($Al_2O_3$), magnesium oxide (MgO), calcium oxide (CaO) or germanium dioxide ($GeO_2$).

To the circumferential surface 5 of the conical lens part 3, adjacent to the antireflection coating 9a, an oleophobic coating 6, 7 (not shown in FIG. 1a) is applied which expands further over the planar lens area 2 and which includes an adhesive layer 6 consisting of aluminium oxide ($Al_2O_3$). As an alternative, the adhesive layer 6 can also consist of some other material, for example $SiO_2$. The adhesive layer 6 can also be a gradient layer, by means of which a transition from a metal oxide (e.g. chromium oxide) with a predominant polar component of the surface energy to a metal (e.g. chromium) with a predominant disperse component of the surface energy is created.

An oleophobic layer 7 includes an ormocer, i.e. a special type of siloxane, is applied to the adhesive layer 6. This ormocer has a polar component of the surface energy of below 10 mN/m and a disperse component that is also below 25 mN/m. As an alternative, silanes, diamond-like carbon or short-chain organic materials with a polar group can be used as an oleophobic layer. The coating 6, 7 can include an additional layer of a UV-light-absorbent material, which additional layer prevents stray light from reaching the region outside the optically free diameter from reaching the wafer. The oleophobic coating 6, 7 ensures that at the circumferential surface 5, wetting with the (immersion-) liquids stated further below is possible only to a very limited extent because the oleophobic coating 6, 7 produces a contact angle of more than 50° between the surface of the oleophobic layer 7 and the respective liquid.

In addition to the region shown, the oleophobic coating 6, 7 can also be applied to a lens edge, e.g. at a cylindrically circumferential lateral area. In this way a situation can be avoided in which in the case of an optical element 1 installed in an optical arrangement water can enter in a gap between the lens and a holder.

Furthermore, on the antireflection coating 9a of the conical lens part 3, the optical element 1 includes an oleophilic coating 9b, 9c with an adhesive layer 9b of magnesium fluoride, to which an oleophilic layer 9c of a siloxane is applied. In this arrangement the disperse component of the surface energy of the oleophilic layer 9c is more than 25 mN/m. The oleophilic layer 9c may also include other materials, for example silanes, diamond-like carbon (DLC), chlorofluoro polymers, bromofluoro polymers, fluoroiodine polymers, or a thin coating with a coating thickness of less than 5 nm of a single, preferably metallic, chemical element such as gadolinium (Gd), tellurium (Te), selenium (Se), erbium (Er), silver (Ag), gold (Au) or platinum (Pt). In this case a thin oxide layer or fluoride layer of the respective chemical element can be used as an adhesive coating. The oleophilic layer 9c ensures that the optical element provides good wetting when being brought into contact with a non-polar liquid, wherein the contact angle for the liquids stated further below is less than 30°, ideally less than 5°.

The surfaces 2, 5 where the oleophobic coating 6, 7 is formed, or the surface 4, where the oleophilic coating 9b, 9c is formed, may be microstructured in order to enhance the oleophobic properties of the oleophobic coating 6, 7, or the oleophilic properties of the oleophilic coating 9b, 9c. The microstructured surfaces 2, 4, 5 may have microstructures with a structural width distribution, wherein less than 1% of the microstructures have a structural width of more than 200 nm in order to generate a minimum amount of stray light. Alternatively or additionally, the oleophilic coating 9b, 9c and/or the oleophobic coating 6, 7 themselves may also be microstructured. In both cases, microstructuring can be generated through etching using an etching mask or in a different way.

The oleophobic coating 6, 7 and the oleophilic coating 9b, 9c are applied to the optical element 1 by means of CVD technology. It is understood for this purpose, as an alternative, other coating technologies can also be used, such as PVD, PECVD, cold gas spraying, spin coating, plasma spraying, IBS, magnetron sputtering, pyrolysis, dip coating, spraying and manual coating, in particular application by brush or sponge.

Furthermore, instead of a two-layer oleophobic coating 6, 7 and a two-layer oleophilic coating 9b, 9c, coatings including a greater or lesser number of layers can also be used. More than two layers can be applied to improve adhesion of the oleophobic layer 7 or of the oleophilic layer 9c. It may also be sufficient to use only a single layer of a UV-resistant material as an oleophobic coating, for example consisting of $HfO_2$, which absorbs UV radiation at less than 280 nm and thus contributes to the avoidance of stray light. Similarly, the oleophilic coating can include only a single layer, e.g. of siloxane, if a material for the optical element is selected to which material the oleophilic layer adheres well.

Figure 2:
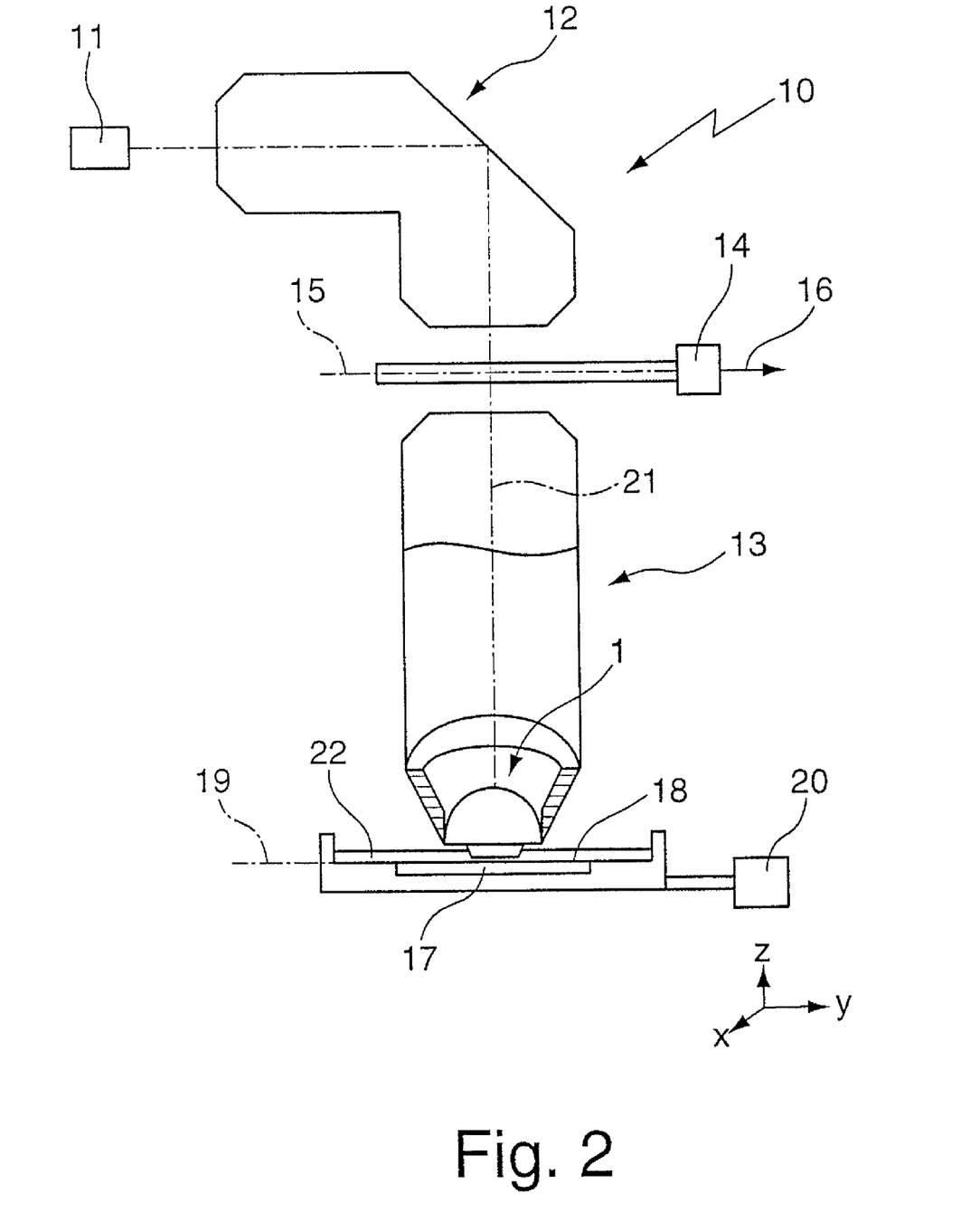
FIG. 2 a diagrammatic view of a projection exposure apparatus for microlithography with the optical element according to FIGS. 1a,b as a terminating element of a projection lens.

The function of the optical element 1 is expediently described in the context of the exposure operation of a projection exposure apparatus 10 for microlithography, as shown in FIG. 2 in the form of a wafer scanner for producing highly-integrated semiconductor components.

The light source of the projection exposure apparatus 10 is an excimer laser 11 with an operating wavelength of 193 nm, wherein other operating wavelengths, for example 248 nm, are also possible. An illumination system 12, arranged downstream, in its exit plane produces a large, sharply delimited, very homogeneously illuminated image field that matches the telecentry requirements of a downstream projection lens 13.

Downstream of the illumination system 12, a device 14 for holding and manipulating a photomask (not shown) is arranged such that the latter is situated in the object plane 15 of the projection lens 13 and in this plane, for scanning operation, can be moved in a movement direction indicated by an arrow 16.

Downstream of the plane 15, also referred to as mask plane, there follows the projection lens 13 which images an image of the photomask at a reduced scale, for example at a scale of 4:1 or 5:1 or 10:1, onto a wafer 17 to which a photoresist layer is applied. The wafer 17, which serves as a light-sensitive substrate, is arranged so that the plane substrate surface 18 with the photoresist layer essentially coincides with the image plane 19 of the projection lens 13. The wafer 17 is held by a device 20 that includes a scanner drive in order to move the wafer 17 synchronously to the photomask and parallel to it. The device 20 also includes manipulators in order to move the wafer both in the z-direction parallel to an optical axis 21 of the projection lens, and in the x- and y-directions perpendicular to this axis.

The projection lens 13 includes the optical element 1 of FIGS. 1a, b as a terminating element adjacent to the image plane 19, i.e. the optical element 1 is a transparent planoconvex lens with a conical lens part 3 whose face 4 forms the last optical surface of the projection lens 13, with the face 4 being arranged at a working distance above the substrate surface 18. Between the face 4 and the substrate surface 18, an organic immersion liquid 22 is arranged, in the present case IF 132, which immersion liquid 22 increases the exit-end numerical aperture of the projection lens 13. As an alternative, for example HIL-203, HIL-204, IF131, IF169, IF175, n-decane, n-hexane, dekalin, cyclo-decane or cyclo-hexane can be used as highly refractive liquids. By means of the immersion liquid, imaging of structures onto the photomask can take place at greater resolution and depth of field than is possible if the space between the optical element 1 and the wafer 17 is filled with a medium of a lower refractive index, e.g. air.

The projection lens 13 includes a holding device (not shown) for the optical element 1, which holding device makes it possible to install and deinstall the optical element 1, without there being a need to dismantle the projection lens 13. To this effect the optical element 1 is attached to the holding device by way of a detachable connection, e.g. a snap-in mechanism, a catch or lock arrangement or a thread. By means of the detachable connection the optical element 1 can be exchanged when the oleophilic layer 9c has been degraded, as a result of long-term intensive UV irradiation, to such an extent that adequate optical performance of the projection exposure apparatus can no longer be ensured. As an alternative, repair of the oleophilic layer 9c is possible, e.g. in that a new layer of an oleophilic material is applied onto the degraded layer.

It is understood that optical elements with an oleophobic and/or oleophilic coating as described above can not only be used as terminating elements of projection lenses for microlithography, but can be advantageously used also in other fields, namely whenever in an arrangement an optical element is provided which is at least in part immersed into an organic liquid.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An optical element comprising:
   a material that is transparent to wavelengths in the ultraviolet region, and
   an oleophobic coating outside of an optically free diameter of the optical element, wherein the coating has a disperse component of the surface energy of 25 mN/m or less.

2. The optical element according to claim 1, wherein the oleophobic coating forms a contact angle of 50° or more to a non-polar liquid.

3. The optical element according to claim 1, wherein the oleophobic coating comprises a polar component of the surface energy of 10 mN/m or more.

4. The optical element according to claim 1, further comprising a reflection-reducing coating, wherein the oleophobic coating is applied to a region of the optical element not coated with the reflection-reducing coating.

5. The optical element according to claim 1, wherein the oleophobic coating comprises at least one oleophobic layer selected from the group consisting of silanes, siloxanes and diamond-like carbon.

6. The optical element according to claim 1, wherein the oleophobic coating comprises at least one oleophobic layer, and wherein the oleophobic layer is applied to an adhesive layer.

7. The optical element according to claim 6, wherein the transparent material consists essentially of an oxidic material, and wherein a material of the adhesive layer an oxidic gradient layer or is selected from the group consisting of sapphire ($Al_2O_3$) and fused silica ($SiO_2$).

8. The optical element according to claim 1, wherein the oleophobic coating comprises at least one layer that is non-transparent to wavelengths in the ultraviolet region.

9. The optical element according to claim 1, wherein:
   the optical element, within the optically free diameter, comprises a coating that is transparent to wavelengths in the ultraviolet region and that is oleophilic, and
   a disperse component of the surface energy of the oleophilic coating is more than 25 mN/m.

10. The optical element according to claim 9, wherein the oleophilic coating forms a contact angle of less than 30° to a non-polar liquid.

11. The optical element according to claim 9, wherein the oleophilic coating comprises a polar component of the surface energy of 10 mN/m or more.

12. The optical element according to claim 9, wherein the oleophilic coating is applied to a reflection-reducing coating.

13. The optical element according to claim 9, wherein the oleophilic coating comprises at least one oleophilic layer comprising a material selected from the group consisting of silanes, siloxanes, diamond-like carbon, chlorofluoro polymers, bromofluoro polymers, fluoroiodine polymers, gadolinium (Gd), tellurium (Te), selenium (Se), erbium (Er), silver (Ag), gold (Au) and platinum (Pt).

14. The optical element according to claim 13, wherein the oleophilic layer has a thickness of 5 nm or less.

15. The optical element according to claim 13, wherein the oleophilic layer is applied to an adhesive layer.

16. The optical element according to claim 9, wherein at least one of the oleophobic coating and the oleophilic coating is at least one of microstructured and arranged on a microstructured surface of the optical element.

17. The optical element according to claim 16, wherein the microstructures have a structural width distribution, and wherein less than 1% of the microstructures have a structural width of more than 200 nm.

18. A projection lens for imaging a structure onto a light-sensitive substrate, comprising at least one optical element as claimed in claim 1.

19. The projection lens according to claim 18, wherein the optical element is a terminating element of the projection lens, which terminating element is adjacent to the light-sensitive substrate.

20. The projection lens according to claim 19, further comprising a detachable connection holding the optical element.

21. A projection exposure apparatus for immersion lithography, comprising:
 an illumination system,
 a projection lens according to claim 18,
 a light-sensitive substrate, and
 a non-polar immersion liquid arranged between the light-sensitive substrate and the optical element.

22. The projection exposure apparatus according to claim 21, wherein the optical element, within the optically free diameter, comprises a coating that is transparent to wavelengths in the ultraviolet region and that is oleophilic, and wherein a refractive index of the oleophilic layer at least substantially equals a refractive of the immersion liquid.

23. The projection exposure apparatus according to claim 21, wherein the refractive index $n_L$ of the oleophilic layer is given by $n_L = \sqrt{n_4 n_S}$, where $n_4$ denotes the refractive index of the immersion liquid, and $n_S$ denotes the refractive index of the material of the optical element.

24. The projection exposure apparatus according to claim 21, wherein at least an end face of a conically shaped lens part of the optical element dips into the immersion liquid.

25. An optical element comprising:
 a material that is transparent to wavelengths in the ultraviolet region, and
 at least one of an oleophobic coating outside of an optically free diameter and an oleophilic coating that is transparent to wavelengths in the UV region inside the optically free diameter, wherein the at least one of the oleophobic coating and the oleophilic coating is at least one of microstructured and arranged on a microstructured surface of the optical element.

26. The optical element according to claim 25, wherein the microstructures have a structural width distribution, and wherein less than 1% of the microstructures have a structural width of more than 200 nm.

27. The optical element according to claim 18, wherein the transparent material is selected from the group consisting of: barium fluoride ($BaF_2$), fused silica ($SiO_2$), potassium chloride (KCl), sodium chloride (NaCl), spinel ($MgAl_2O_4$), sapphire ($Al_2O_3$), magnesium oxide (MgO), lutetium aluminium garnet (LuAG), calcium oxide (CaO) and germanium dioxide ($GeO_2$).

28. The optical element according to claim 25, wherein at least one layer of the oleophilic coating or of the oleophobic coating is applied by a method selected from the group consisting of: physical vapour deposition, chemical vapour deposition, plasma-enhanced chemical vapour deposition, cold gas spraying, spin coating, plasma spraying, ion beam sputtering, magnetron sputtering, pyrolysis, dip coating, spraying and manual coating.

29. The optical element according to claim 25, configured as a plano-convex lens, and having a planar surface on which a conically shaped lens part is formed.

30. The optical element according to claim 29, wherein the oleophobic coating is applied to at least one of a conical circumferential surface of the conically shaped lens part and the planar surface.

31. The optical element according to claim 29, wherein the oleophilic coating is formed on an end face of the conically shaped lens part.

* * * * *

UNITED STATES PATENT AND TRADEMARK OFFICE
CERTIFICATE OF CORRECTION

PATENT NO. : 7,738,187 B2 Page 1 of 1
APPLICATION NO. : 12/134062
DATED : June 15, 2010
INVENTOR(S) : Alexandra Pazidis, Stephan Six and Ruediger Duesing It is certified that error appears in the above-identified patent and that said Letters Patent is hereby corrected as shown below:

Column 7, line 35, delete "piano-convex lens" and insert --plano-convex lens--

Column 8, line 51, delete "and ns" and insert --and $n_s$--

Column 9, line 21, delete "piano - convex lens" and insert --plano-convex lens--

Column 14, line 15, claim 27 delete "claim 18" and insert --claim 25--

Signed and Sealed this

Thirtieth Day of November, 2010

David J. Kappos
*Director of the United States Patent and Trademark Office*